US011487211B2

(12) United States Patent
Auth et al.

(10) Patent No.: US 11,487,211 B2
(45) Date of Patent: Nov. 1, 2022

(54) DEVICE AND METHOD FOR PROCESSING A MICROSTRUCTURED COMPONENT

(71) Applicant: Carl Zeiss SMT GmbH, Oberkochen (DE)

(72) Inventors: Nicole Auth, Ginsheim-Gustavsburg (DE); Timo Luchs, Mainz (DE); Joachim Welte, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/116,127

(22) Filed: Dec. 9, 2020

(65) Prior Publication Data

US 2021/0173310 A1 Jun. 10, 2021

(30) Foreign Application Priority Data

Dec. 10, 2019 (DE) .......................... 102019133658.9

(51) Int. Cl.
*G03F 7/20* (2006.01)
*H01J 37/08* (2006.01)
*H01J 37/244* (2006.01)

(52) U.S. Cl.
CPC ............ *G03F 7/7085* (2013.01); *H01J 37/08* (2013.01); *H01J 37/244* (2013.01); *H01J 2237/24475* (2013.01)

(58) Field of Classification Search
CPC . G03F 7/7085; G03F 1/74; G03F 1/86; G03F 7/20; G03F 7/70033; H01J 37/08; H01J 37/244; H01J 2237/24475; H01J 2237/30466; H01J 37/304; H01J 37/30
See application file for complete search history.

(56) References Cited

U.S. PATENT DOCUMENTS

| | | | | |
|---|---|---|---|---|
| 6,498,345 B1 * | 12/2002 | Weimer | ................ | H01J 37/244 250/397 |
| 6,903,337 B2 | 6/2005 | Kienzle et al. | | |
| 7,601,953 B2 * | 10/2009 | Ward | .................... | H01J 37/244 250/309 |
| 8,168,961 B2 | 5/2012 | Straw et al. | | |
| 9,165,742 B1 | 10/2015 | Simmons et al. | | |
| 9,362,086 B2 | 6/2016 | Tüma et al. | | |

(Continued)

FOREIGN PATENT DOCUMENTS

| | | | | |
|---|---|---|---|---|
| CN | 102931044 | 9/2016 | ............. | H01J 37/28 |
| JP | H08-123012 | 5/1996 | ............. | G03F 1/08 |

(Continued)

OTHER PUBLICATIONS

The Notice of Reasons for Rejection issued by the Japanese Patent Office for Application No. JP 2020-204709, dated Nov. 1, 2021 (with English Translation).
Reimer, L. et al.: "Measuring the Backscattering Coefficient and Secondary Electron Yield Inside a Scanning Electron Microscope", *Scanning* vol. 3, pp. 35-39 (1980).

(Continued)

*Primary Examiner* — David A Vanore
(74) *Attorney, Agent, or Firm* — Fish & Richardson P.C.

(57) ABSTRACT

The invention relates to a device and a method for processing a microstructured component, in particular for microlithography. A device for processing a microstructured component comprises an ion beam source for applying an ion beam to at least regions of the component, wherein an ion energy of this ion beam is no more than 5 keV, and a detector for detecting particles backscattered at the component.

31 Claims, 9 Drawing Sheets

(56) References Cited

U.S. PATENT DOCUMENTS

| | | | |
|---|---|---|---|
| 9,443,692 B2* | 9/2016 | Maazouz | H01J 37/248 |
| 9,449,789 B2 | 9/2016 | Kruit | |
| 9,618,463 B2 | 4/2017 | Uncovsky et al. | |
| 9,984,848 B2 | 5/2018 | Frosien | |
| 2003/0123605 A1 | 7/2003 | Rau | |
| 2005/0103746 A1* | 5/2005 | Nadeau | G11B 5/3163 |
| | | | 216/62 |
| 2006/0040418 A1 | 2/2006 | Takaoka | |
| 2009/0146074 A1* | 6/2009 | Banzhof | H01J 37/28 |
| | | | 250/396 R |
| 2009/0289191 A1* | 11/2009 | Frosien | H01J 37/304 |
| | | | 250/424 |
| 2009/0309025 A1 | 12/2009 | Preikszas | |
| 2010/0112464 A1 | 5/2010 | Kanamitsu | |
| 2011/0266465 A1* | 11/2011 | Shichi | H01J 37/08 |
| | | | 250/492.3 |
| 2012/0273458 A1* | 11/2012 | Bret | B82Y 40/00 |
| | | | 134/4 |
| 2013/0037715 A1* | 2/2013 | Boughorbel | G01N 23/22 |
| | | | 250/307 |
| 2016/0042914 A1* | 2/2016 | Martin | H01J 37/28 |
| | | | 250/307 |
| 2016/0148782 A1 | 5/2016 | Agemura et al. | |
| 2016/0322123 A1 | 11/2016 | Aramaki et al. | |
| 2017/0148603 A1 | 5/2017 | Kozakai et al. | |
| 2018/0174798 A1* | 6/2018 | Boguslavsky | G01N 1/286 |
| 2019/0259574 A1 | 8/2019 | Yamamoto et al. | |

FOREIGN PATENT DOCUMENTS

| | | | | |
|---|---|---|---|---|
| JP | 2006-059835 | 3/2006 | | H01L 21/027 |
| JP | 2010-512628 | 4/2010 | | H01J 37/12 |
| JP | 2010-109164 | 5/2010 | | H01L 21/027 |
| JP | 2015-057764 | 3/2015 | | H01J 27/26 |
| JP | 2015-064603 | 4/2015 | | G03F 1/74 |
| JP | 2016-033956 | 3/2016 | | H01L 21/027 |
| JP | 6177915 | 8/2017 | | H01J 37/244 |
| JP | 2019-145328 | 8/2019 | | H01J 37/30 |
| TW | 579536 | 3/2004 | | |

OTHER PUBLICATIONS

Steele, A. V. et al.: "New Ion Source for High Precision FIB Nanomachining and Circuit Edit", *Conference Proceedings from the International Symposium for Testing and Failure Analysis* (2014).

Twedt, K. A. et al.: "Scanning Ion Microscopy with Low Energy Lithium Ions", *Ultramicroscopy*, vol. 142, pp. 24-31 (2014).

The German Office Action for German Application No. DE 10 2019 133 658.9, dated Jun. 24, 2020 (with English Translation).

Aramaki, F., et al., "Development of new FIB technology for EUVL mask repair", *Proceedings of SPIE*, vol. 7969, pp. 79691C-1-79691C-7 (2011).

Edinger, K., et al., "Electron-beam-based photomask repair", *Journal of Vacuum Science & Technology B*, vol. 6, pp. 2902-2906 (2004).

Gonzalez, C., et al., "Focused helium and neon ion beam induced etching for advanced extreme ultraviolet lithography mask repair", *Journal of Vacuum Science & Technology B*, vol. 32, No. 2, pp. 21602-1-21602-9 (2014).

Isogawa, T., et al., "Screening EUV mask absorbers for defect repair", *Proceedings of SPIE*, vol. 9256, pp. 92560N-1-92560N-9 (2014).

Melngailis, J., "Focused ion beam technology and applications", *Journal of Vacuum Science & Technology B*, vol. 5, No. 2, pp. 469-495 (1987).

Rauscher, M., "Development of an Advanced Low Energy Focused Ion Beam System Based on Immersion Optics", *Dissertation*, University of Tübingen (2006).

Tseng, A., "Recent Developments in Nanofabrication Using Focused Ion Beams", *Small*, vol. 1, No. 10, pp. 924-939 (2005).

Yasaka, A., et al., "Nanoscale Imaging, Material Removal and Deposition for Fabrication of Cutting-edge Semiconductor Devices", *Hitachi Review*, vol. 65, No. 7, pp. 223-237 (2016).

Office Action and Search Report issued by the Taiwan Patent Office for Application No. TW 109143415, dated Sep. 30, 2021 (with English Translation).

The Decision of Rejection issued by the Japanese Patent Office for Application No. JP 2020-204709, dated Jul. 19, 2022 (with English Translation).

* cited by examiner

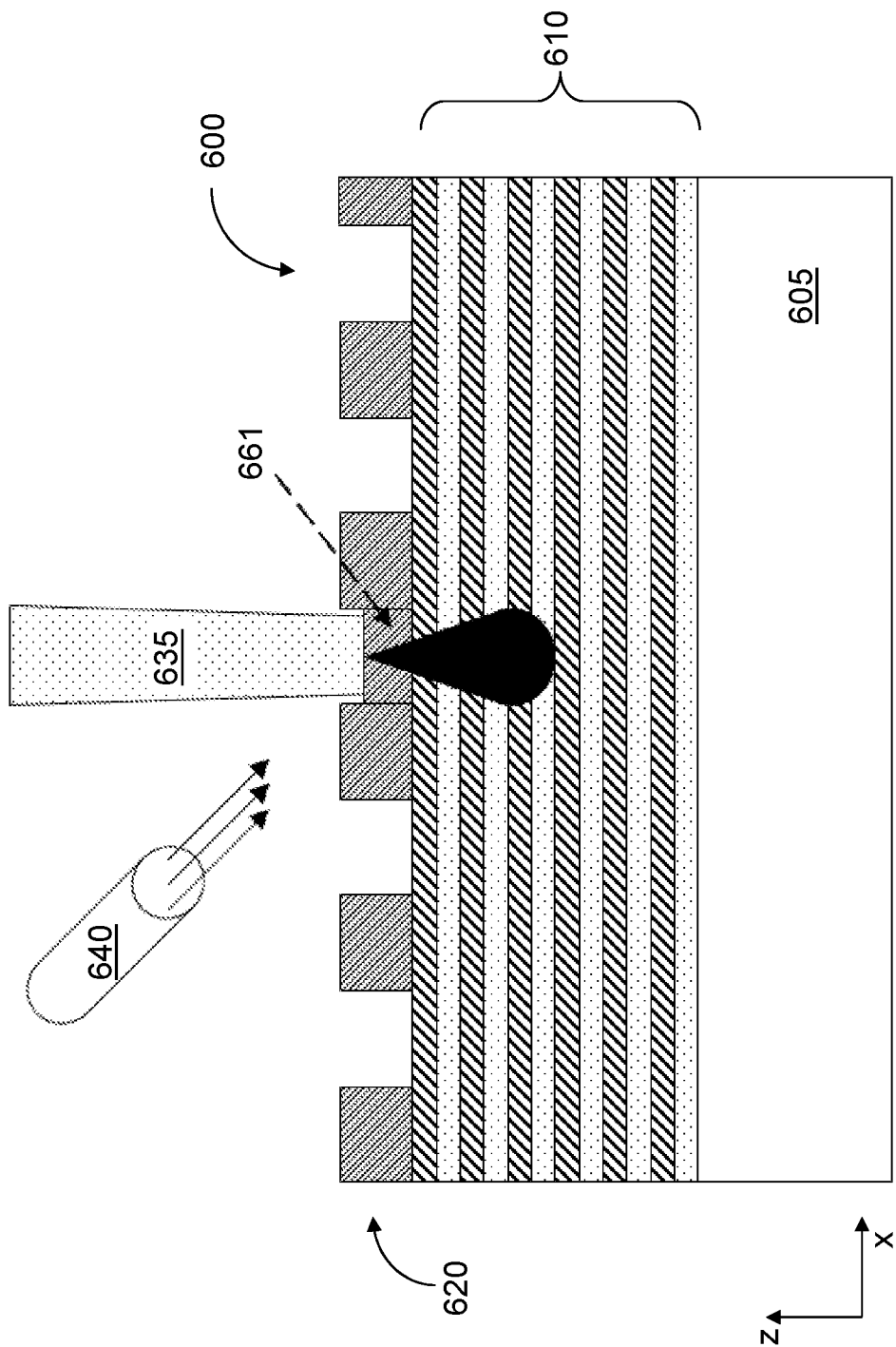

DEVICE AND METHOD FOR PROCESSING A MICROSTRUCTURED COMPONENT

CROSS-REFERENCE TO RELATED APPLICATIONS

This application claims priority of German Patent Application DE 10 2019 133 658.9, filed on Dec. 10, 2019. The content of this application is hereby incorporated by reference in its entirety.

TECHNICAL FIELD

The invention relates to a device and a method for processing a microstructured component, in particular for microlithography.

BACKGROUND

Microlithography is used for production of microstructured components, such as integrated circuits or LCDs, for example. The microlithography process is conducted in what is called a projection exposure apparatus, which comprises an illumination device and a projection lens. The image of a mask (also referred to as a reticle) illuminated by the illumination device is in this case projected by the projection lens onto a substrate (e.g., a silicon wafer) coated with a light-sensitive layer (e.g., photoresist) and arranged in the image plane of the projection lens, in order to transfer the mask structure to the light-sensitive coating of the substrate.

As the structure sizes of both the masks used in the lithography process and the microlithographically structured wafers become ever smaller, the respective processing or repair of these components is becoming ever more of a demanding challenge in practice. A problem arising in the case of known approaches for processing or repairing the corresponding components such as masks or wafers using electron or ion beams is that the resolution obtainable by use of the respective "tool" or particle beam must be sufficiently high in order to be meet the needs of the respective structure sizes on the microstructured component to be processed.

In practice, the realization of correspondingly high resolutions, particularly in the case of structure sizes of the order of 10 nm or less, is made more difficult by the fact that it is not only the lateral resolution (i.e., the resolution obtained within a plane parallel to the surface of the component to be processed) but also the vertically obtained resolution (i.e., the resolution extending in a direction perpendicular to the surface of the component to be processed) that needs to be taken into account, and so the penetration depth of the particle beam into the component to be processed also needs to be limited in order to avoid unwanted excessive material ablation. Not least, the required focusing of the respective particle beam represents a demanding practical challenge in this case.

SUMMARY

In a general aspect, the present invention provides a device and a method for processing a microstructured component, in particular for microlithography, which facilitate processing that is as precise as possible, even in the case of structure sizes in the nanometer range. For example, the invention can be implemented by a device for processing a microstructured component, in which the device includes: an ion beam source configured to apply an ion beam to at least regions of the component, wherein an ion energy of the ion beam is no more than 5 keV; and a detector for detecting particles backscattered at the component; wherein the detector is designed to detect ions backscattered at the component. For example, the invention can be implemented by a method for processing a microstructured component, in which the method includes the following steps: applying an ion beam to the component, in which an ion energy of the ion beam is no more than 5 keV; and using a detector to detect particles backscattered at the component; wherein the particles comprise ions.

In another general aspect, an apparatus for processing a microstructured component, in particular for microlithography, comprises an ion beam source for applying an ion beam to at least regions of the component, wherein an ion energy of this ion beam is no more than 5 keV; and a detector for detecting particles backscattered at the component.

Implementations of the apparatus can include one or more of the following features. According to one embodiment, the detector is designed to detect electrically charged particles, in particular ions or electrons, backscattered at the component.

In particular, the invention is based on the concept of, firstly, achieving an increase in the obtainable resolution when processing a microstructured component such as a microlithographic mask or a wafer by using a comparatively low-energy ion beam—as a consequence of the comparatively small volume of interaction between the ion beam and the material of the component to be processed. Secondly, it is possible to precisely define the end of the processing (in terms of location and/or time) by detecting ions backscattered at the component to be processed—as will be explained below.

Here, the invention proceeds, in particular, from the discovery that, when an ion beam is used for material processing instead of electron beams, the transition to lower energies of the respective particle beam (i.e., the ion or electron beam) is not accompanied by a decrease in the "material contrast" occurring during the processing. Rather, the invention makes use of the circumstances that—as described in more detail below—the low-energy ions used according to the invention for material processing firstly have the desired dependence of the backscatter coefficient on the respective target material and secondly also have a sufficiently high backscatter rate overall (and hence also a sufficiently strong signal for defining the end of the processing).

Overall, according to the invention, processing or a repair of microstructured components such as, e.g., masks or wafers is provided, which both provides the resolutions required for current and future demands with structure sizes of the order of 10 nm or less and also—for the purposes of precisely ending the respective processing or repair process—is sufficiently sensitive to the respectively processed material (by virtue of a sufficient material contrast being present at the transition between different target materials during the processing).

According to one embodiment, an ion energy of the ion beam is no more than 3 keV, in particular no more than 2 keV.

According to one embodiment, an ion energy of the ion beam has a value ranging from 0.1 to 5 keV, in particular ranging from 0.5 to 3 keV, further particularly ranging from 1 to 2 keV.

According to one embodiment, the apparatus is configured to define an end of the processing on the basis of a detector signal supplied by the detector.

According to one embodiment, the ion beam comprises ions from the group containing hydrogen (H) ions, lithium (Li) ions, sodium (Na) ions, potassium (K) ions, rubidium (Rb) ions, caesium (Cs) ions, nitrogen (N) ions, helium (He) ions, neon (Ne) ions, argon (Ar) ions, krypton (Kr) ions and xenon (Xe) ions.

According to one embodiment, the ion beam has a focal diameter of less than 10 nm, in particular less than 5 nm, with further preference less than 2 nm.

According to one embodiment, the apparatus further comprises a gas supply for additionally applying a process gas to the component. As a result, the energy influx into the respective material of the processed component, generated by the ion beam, can be used for a reaction between the process gas and the material with the generation of volatile compounds and hence for an additional mechanism for material ablation which complements the physical ("sputtering") ablation directly caused by the ions.

According to one embodiment, structures present on the microstructured component have a structure size of less than 10 nm.

According to one embodiment, the processing of the microstructured component comprises an ablation of material situated between structures present on the microstructured component.

According to one embodiment, the component is a microlithographic mask.

According to one embodiment, the component is a microlithographically structured wafer.

The invention furthermore also relates to a method for processing a microstructured component, wherein the method includes the following steps:

applying an ion beam to the component, wherein an ion energy of this ion beam is no more than 5 keV; and using a detector to detect particles backscattered at the component.

According to one embodiment, the particles are electrically charged particles, in particular ions or electrons.

According to one embodiment, the method further includes the step of: defining an end of the processing on the basis of a detector signal supplied by the detector.

According to one embodiment, the method is carried out using a device having the above-described features. With regard to advantages and preferred embodiments of the method, reference is made to the above explanations in association with the device according to the invention.

Further configurations of the invention can be gathered from the description and the dependent claims.

The invention is explained in greater detail below on the basis of exemplary embodiments illustrated in the accompanying figures.

BRIEF DESCRIPTION OF DRAWINGS

FIGS. 6A-6B show schematic illustrations for explaining further problems which occur in a conventional device.

DETAILED DESCRIPTION

Figure 1:
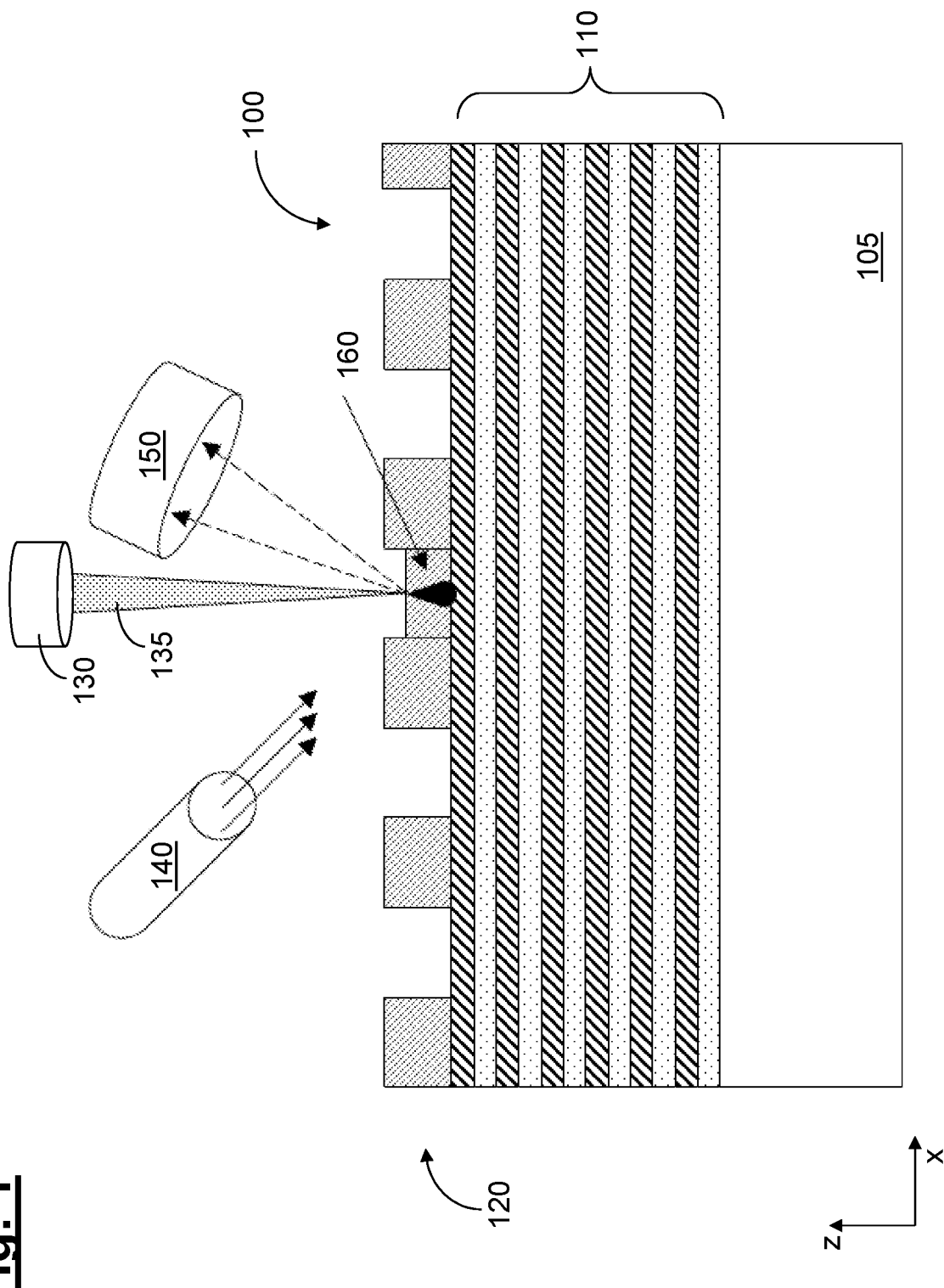
FIG. 1 shows a schematic illustration for explaining the construction and functionality of a device according to the invention for processing a microstructured component in the form of a microlithographic mask.

FIG. 1 shows a purely schematic illustration for explaining the construction and functionality of a device according to the invention for processing a microstructured component.

Here, the microstructured component 100 to be processed in the exemplary embodiment of FIG. 1 is a microlithographic mask which, once again in exemplary fashion, is designed as a reflective mask for use in the EUV range (i.e., at an operating wavelength of less than 30 nm, in particular less than 15 nm).

The component 100 comprises—without the invention being restricted thereto—a substrate 105, a multiple layer system 110, e.g., made of an alternating sequence of molybdenum (Mo) and silicon (Si) layers, and a structured layer 120, which can be formed, for example, from tantalum nitride (TaN).

As indicated schematically and in greatly simplified fashion in FIG. 1, the mask structure formed by the structured layer 120 has a defect 160 in the form of a collection of excess material, which should be removed by way of processing.

To process the component 100, the device according to the invention comprises an ion beam source 130, by use of which an ion beam 135 with comparatively low energy (in particular, no more than 5 keV) is able to be applied to the component 100. In the specific exemplary embodiment, the ions can be, for example, lithium (Li) ions with an ion energy of 1 keV.

An optional gas supply for additionally applying a process gas, which can be, for example, xenon difluoride (XeF2), to the component 100 is denoted by "140". If such a process gas is used, the energy influx into the respective material of the component 100 generated by the ion beam 135 can be used for a reaction between the process gas and the material for the purposes of generating volatile compounds (e.g., fluorine compounds).

Moreover, the device according to the invention as per FIG. 1 comprises a detector 150 for detecting particles backscattered at the component 100. In particular, the particles can be electrically charged particles, more particularly ions or electrons. Moreover, the assumption is made (without the invention being restricted thereto) that the backscattered particles are ions. By way of the detector 150, it is possible—as yet to be explained in more detail below with reference to FIGS. 4A-4C—to define the end of the processing process, based upon the material contrast in respect of the backscatter coefficients, on the basis of the respectively supplied detector signal by way of determining the backscatter rate of the ions (which in turn depends on the respective target material).

Figure 2:
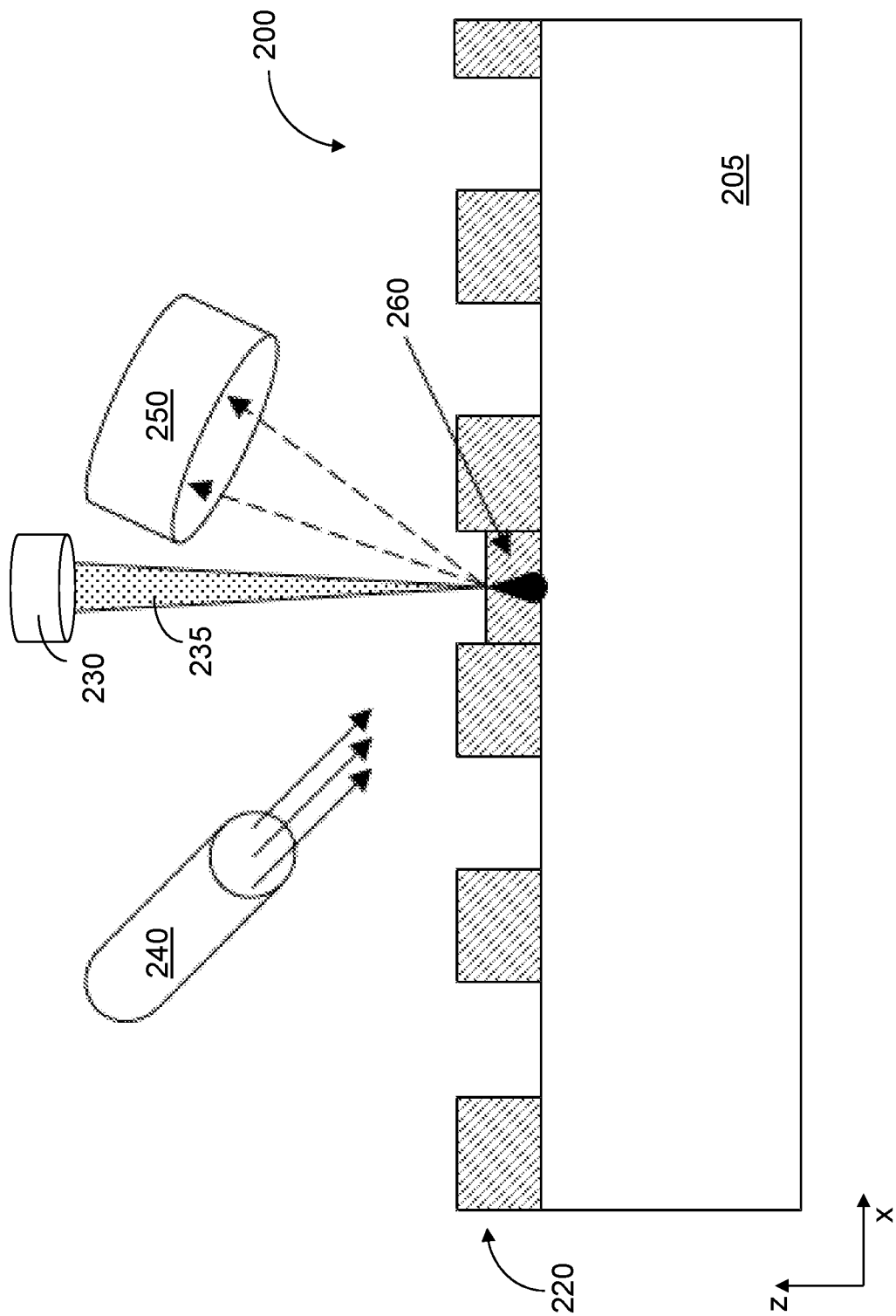
FIG. 2 shows a schematic illustration for explaining the construction and functionality of a device according to the invention for processing a microstructured component in the form of a microlithographically structured wafer.

FIG. 2 shows a further schematic illustration of the construction and functionality of a device according to the invention for processing a microstructured component, the microstructured component 200 to be processed being a microlithographically structured wafer in this case, with the microlithographically produced structures of this wafer being denoted by "220". Otherwise, components analogous or substantially functionally identical in comparison with FIG. 1 are denoted by reference numerals increased by "100".

Figure 3A:
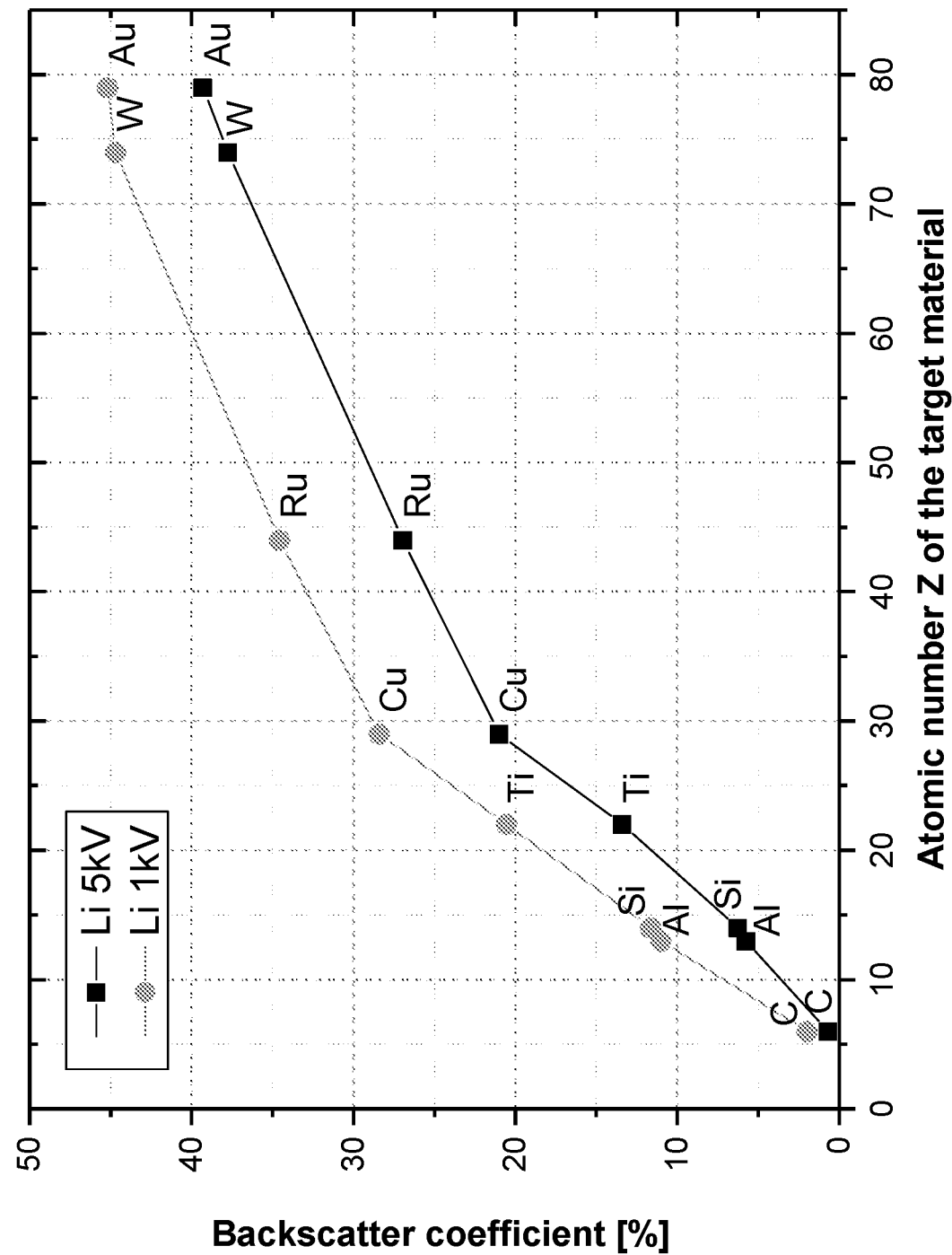
FIGS. 3A-3B show diagrams for explaining further aspects of the present invention.

The invention makes use of the circumstances that the use according to the invention of comparatively low-energy ions (with an energy of 5 keV or less) supplies a material contrast that is sufficient to define the end of the processing process, as will be explained below with reference to FIGS. 3A-3B:

To this end FIG. 3A shows the results of a simulation of the backscatter coefficient as a function of the atomic number of the respective target material (i.e., of the atomic number of the material impinged by the ion beam during the processing), to be precise both for lithium ions with an energy of 1 keV and for lithium ions with an energy of 5 keV. FIG. 3B shows a corresponding diagram, in which the backscatter coefficient is plotted as a function of the ion energy for the selected target materials (carbon (C), silicon (Si), copper (Cu) and gold (Au)).

Figure 3B:
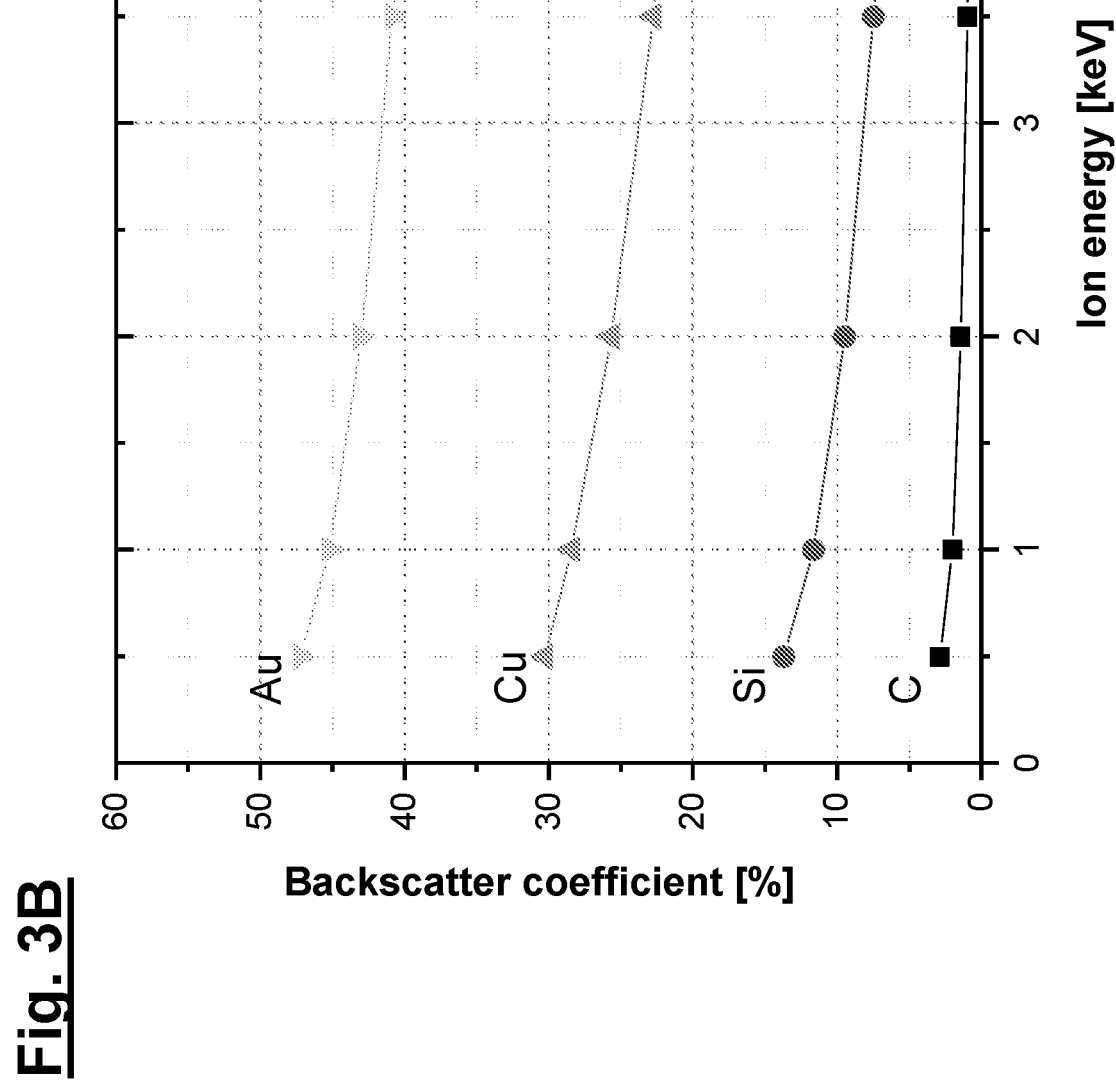

As is evident from FIG. 3A and FIG. 3B, the backscatter coefficient firstly increases when the ion energy is reduced from a value of 5 keV to a value of 1 keV and, secondly, it has a clear dependence on the respective target material at both ion energies, in a manner advantageous for ending the processing process on the basis of the material contrast. Consequently, a material contrast sufficient to define the end of the processing or repair process during the processing, and hence a precise controllability of the processing process, is also provided according to the invention.

Figure 5:
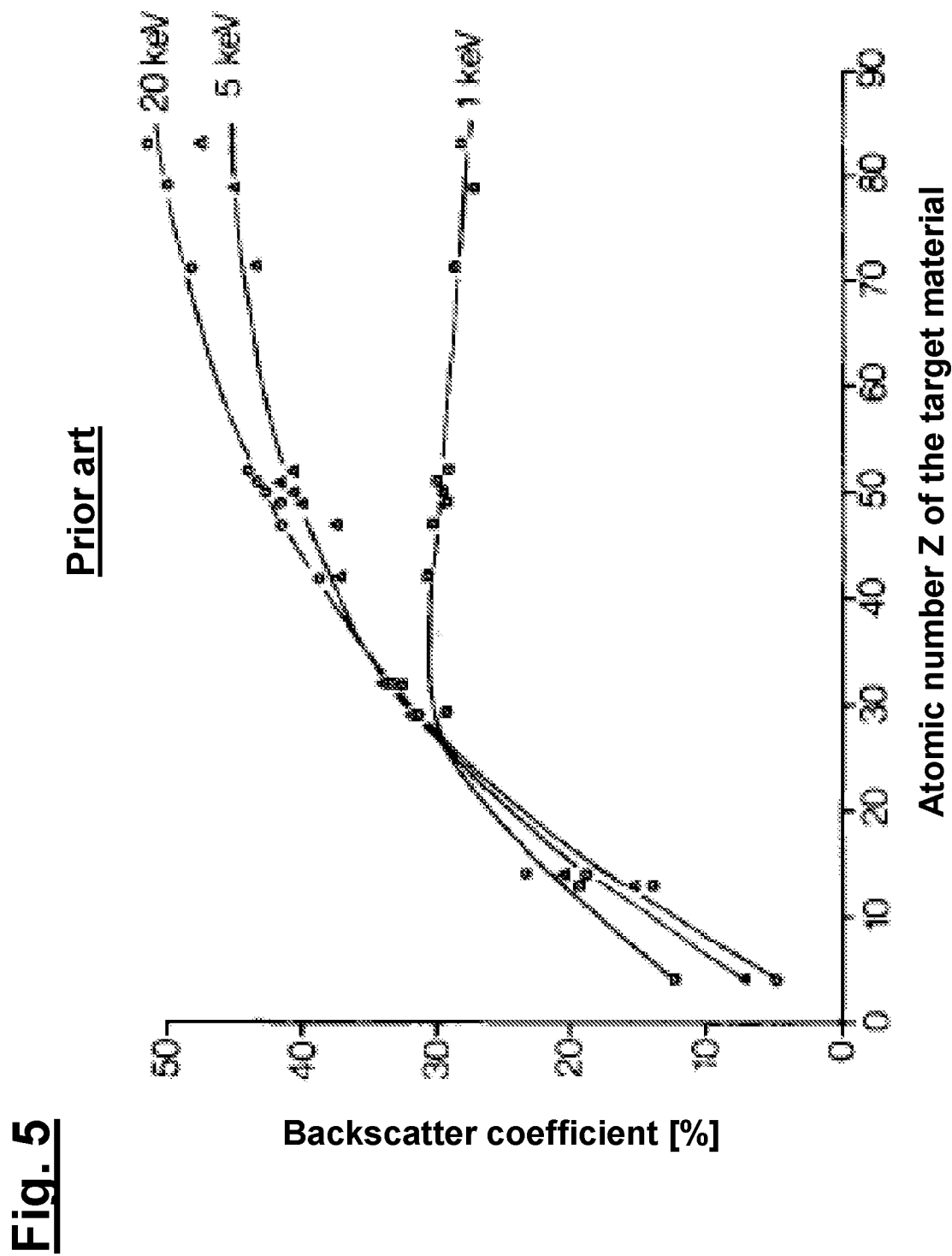
FIG. 5 shows a diagram for explaining a problem which occurs in a conventional device.

FIG. 5 shows a diagram analogous to FIG. 3A for the case where an electron beam is used instead of the ion beam used according to the invention. In contrast to the effect obtained according to the invention as illustrated above on the basis of FIGS. 3A-3B, the diagram of FIG. 5 for the use of an electron beam firstly shows a decrease in the backscatter coefficient with decreasing energy of the electron beam and, secondly, a comparatively low material contrast on account of a largely constant profile of the backscatter coefficients at an electron energy of 1 keV for atomic numbers of Z≥30 of the target material (i.e., a suppression of the dependence of the backscatter coefficient on the atomic number Z of the target material, which is disadvantageous for ending the processing process on the basis of the material contrast).

Figure 4C:
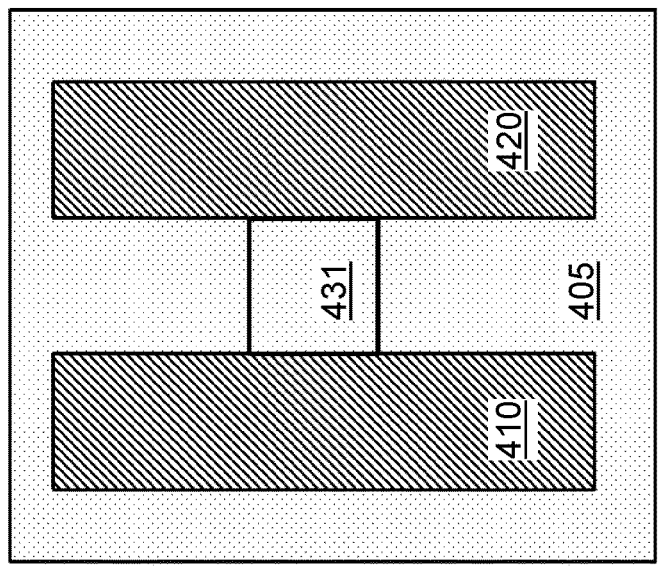
FIGS. 4A-4C show schematic illustrations for explaining a possible realization of the definition of an end of the processing or repair of a microstructured component.
Figure 4B:
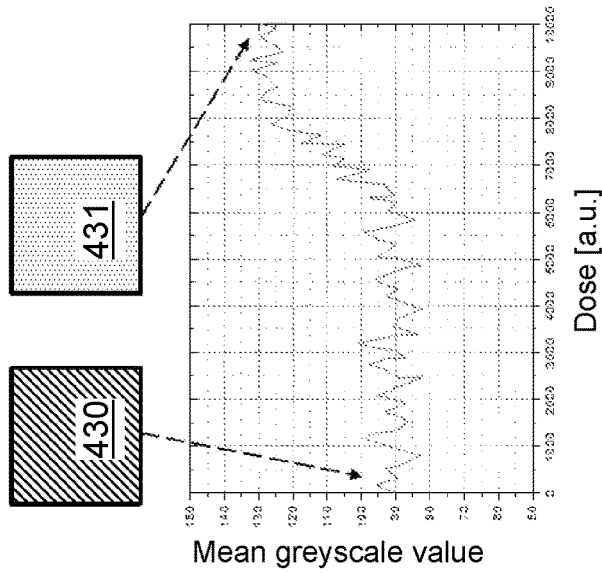
Figure 4A:
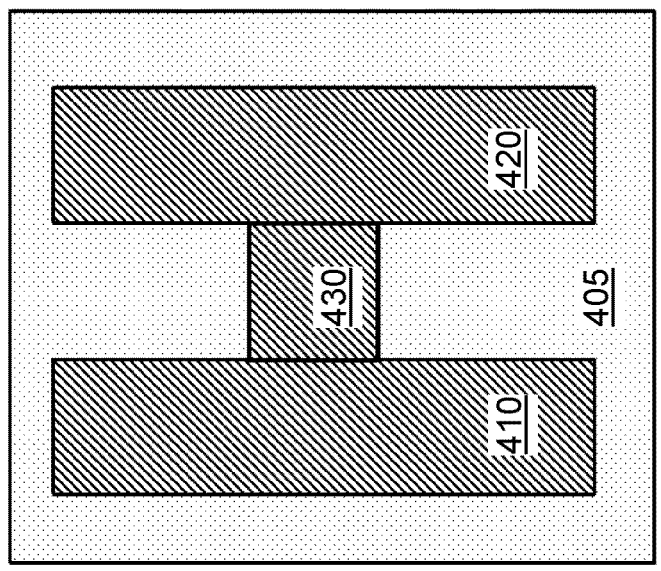
Figure 4A:
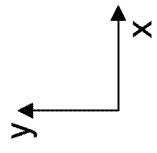

FIGS. 4A-4C show schematic illustrations for explaining the principle underlying a definition of the end of the processing or repair process. Here, the microstructured component to be processed as per FIG. 4A has a line structure made of regions 410, 420 of a first material on a planar continuous layer 405 of a second material, wherein the regions 410, 420 as per FIG. 4A are initially connected via a defect 430—to be removed during the processing or repair process according to the invention—in the form of excess first material. The detection of the ions backscattered during the processing or repair process supplies measurement results which, as per FIG. 4B, can be plotted as a greyscale value dependent on the entire dose introduced into the component to be processed, which is typically repeatedly "scanned" with the ion beam during the processing or repair process. As a result, the implemented ablation of the defect can be ascertained from the curve as per FIG. 4B and hence it is possible to define the end of the processing or repair process, e.g., when reaching the state indicated in FIG. 4C, in which the measurement results indicate that the first material of the defect 430 has been removed and that a material 431 corresponding to the second material on the planar continuous layer 405 has been detected.

In some implementations, the device according to the invention can include a computer that is configured to analyze the detection signal from the detector 150 of FIG. 1 or 250 of FIG. 2, determine the end of the processing or repair process according to the principle shown in FIGS. 4A-4C and described above, and generate an "end process" signal or message to indicate that the state indicated in FIG. 4C has been reached. The "end process" signal or message can be provided to alert a human operator to manually end the processing or repair process, or the device can be configured to automatically end the processing or repair process upon receiving the "end process" signal or message from the computer.

Figure 6A:
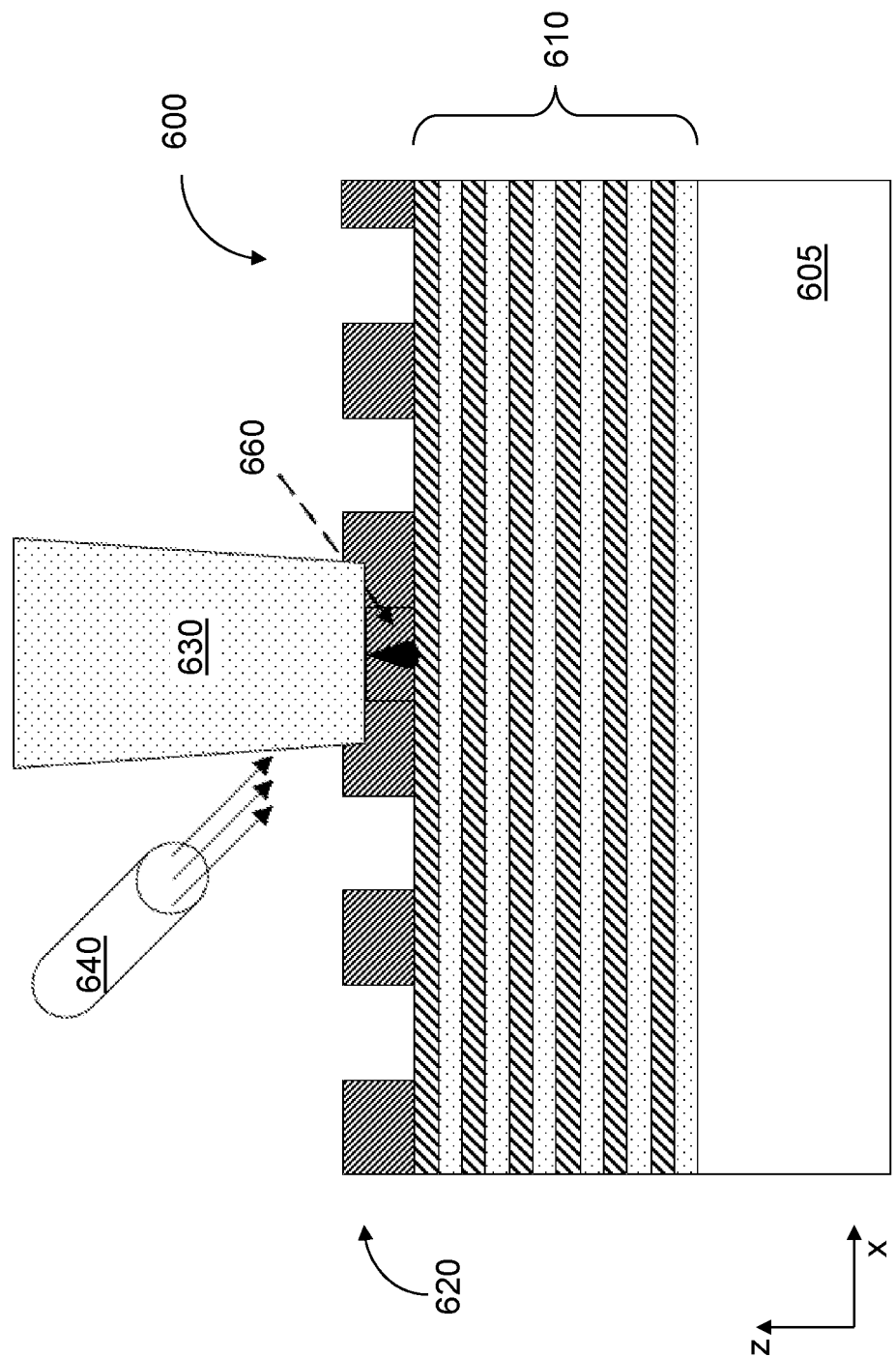

A further advantage obtained according to the invention is elucidated by the comparison of the schematic illustration of FIG. 1 with the illustrations of FIGS. 6A and 6B (wherein components analogous or substantially functionally identical in comparison with FIG. 1 are denoted by reference numerals increased by "500" in FIGS. 6A-6B):

According to the invention, the precise processing or repair of a microstructured component, in particular with structure sizes of the order of 10 nm or less, is implemented by ensuring a sufficient resolution both in the lateral direction (i.e., in a direction extending within a plane parallel to the surface of the component to be processed) and in the vertical direction (i.e., in a direction extending perpendicular to the surface of the component to be processed).

If, as per FIG. 6A, the ion energy of the ion beam 630 used for processing purposes is chosen to be too low, the obtainable lateral resolution is too low, with the consequence that there is material ablation not only in respect of the actual defect 660 but also in respect of adjacent (used) structures. An excessive increase in the ion energy with the goal of increasing the lateral resolution, however, leads as a consequence of the increased penetration depth into the material of the component 600 to be processed to—as indicated in FIG. 6B for a corresponding ion beam 635—a significant energy influx beyond the defect 661 and also into lower layers of the microstructured component 600 (e.g., into the layers of the reflection layer system 610 as per FIG. 6B) and hence to an unwanted modification of the component 600 and an impairment of the optical properties thereof.

By contrast, the use according to the invention of an ion beam 135 or 235 with an ion energy of no more than 5 keV, in particular in the range of 1 keV-2 keV, facilitates, as indicated in FIG. 1 and FIG. 2, the attainment of sufficient resolutions in both the lateral and the vertical direction.

To obtain the focusing of the ion beam 135, 235, which is required for the high lateral resolution, a so-called low temperature ion source (LoTIS), in particular, can be used as an ion beam source 130, 230, whereby it is possible to obtain, e.g., a reduced transversal speed distribution in comparison with conventional FIB (focused ion beam) technologies and, e.g., a virtually perfect beam collimation already upstream of the actual focusing.

In the case of the low temperature ion source, as described, for example, in the publication K. A. Twedt et al.: "Scanning Ion Microscopy with Low Energy Lithium Ions," Ultramicroscopy Vol. 142, 24-31 (2014), neutral lithium atoms are laser-cooled within a magneto-optical trap to approximately 600 µK. In the case of lithium-7 ($^7$Li) atoms, this corresponds to a speed of less than 1 ms$^{-1}$ and further defines the minimal lateral speed variation. With the aid of a further laser, the lithium atoms can be photoionized in a moderate electric field and can be accelerated to the desired energy in an acceleration tube. In the case of lithium-7 ($^7$Li) atoms, an energy of 2 keV corresponds to a longitudinal speed of approximately $2*10^5$ ms$^{-1}$. Consequently, the technology described above allows the realization of a parallel or collimated ion beam with a sharp energy distribution (e.g., 100 meV), which then, in a further step, allows focusing to a small spot dimension, even at low energies. For comparison purposes, typical energy widths in electron microscopes are restricted to at least 500 meV, depending on the emitter type.

Figure 7:
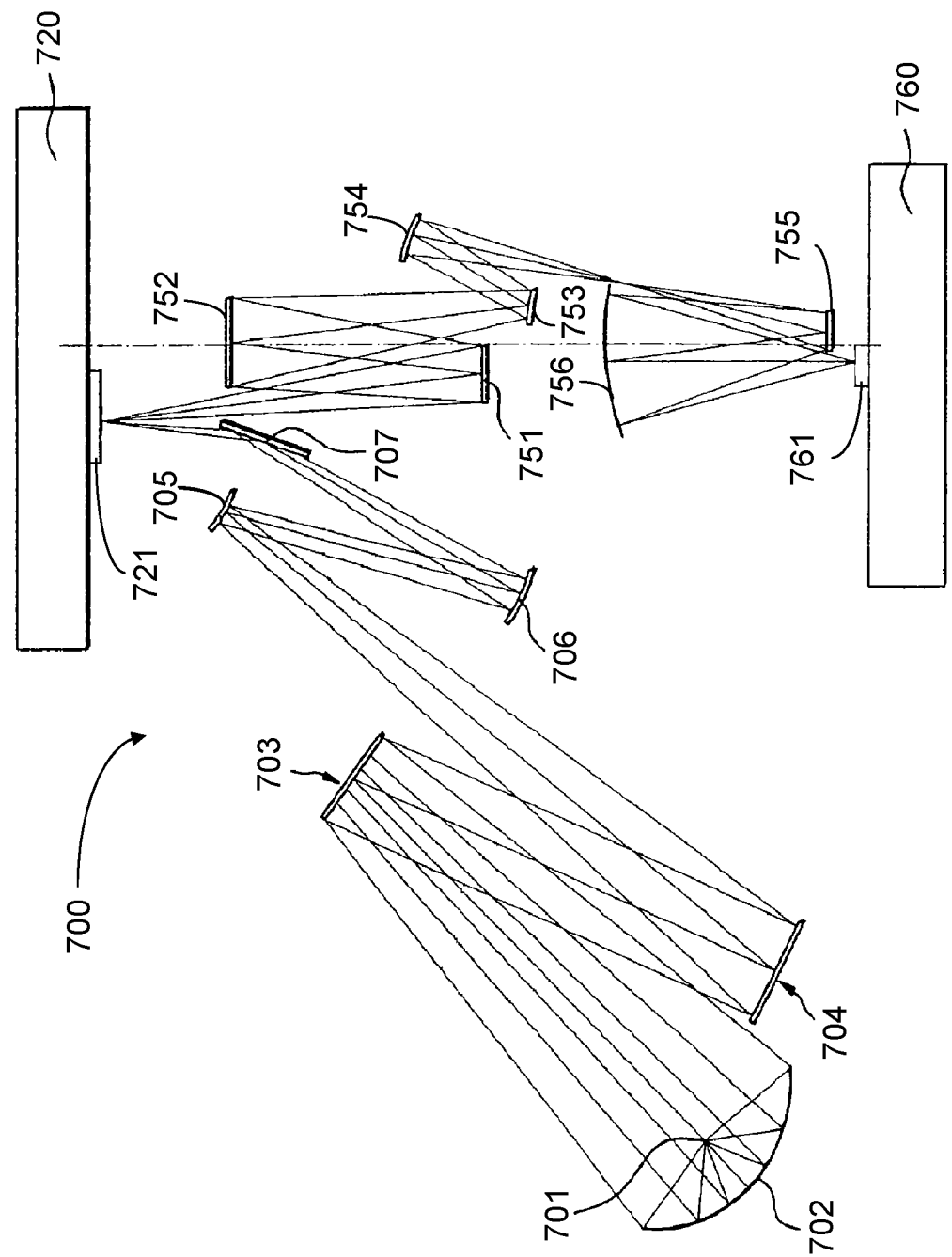
FIG. 7 shows a schematic illustration for explaining the possible construction of a microlithographic projection exposure apparatus designed for operation in the EUV range.

FIG. 7 shows a merely schematic illustration for explaining the possible construction of a microlithographic projection exposure apparatus designed for operation in the EUV range. Here, a mask processed according to the invention can be inserted in the projection exposure apparatus of FIG. 7 or a wafer structured by the projection exposure apparatus of FIG. 7 can be processed with the device according to the invention or the method according to the invention.

According to FIG. 7, in some implementations, an illumination device in a projection exposure apparatus 700 designed for EUV comprises a field facet mirror 703 and a pupil facet mirror 704. The light from a light source unit comprising a plasma light source 701 and a collector mirror 702 is directed at the field facet mirror 703. A first telescope mirror 705 and a second telescope mirror 706 are arranged in the light path downstream of the pupil facet mirror 704. A deflection mirror 707 is arranged downstream in the light path, said deflection mirror directing the radiation that is incident thereon at an object field in the object plane of a projection lens comprising six mirrors 751-756. At the location of the object field, a reflective structure-bearing mask 721 is arranged on a mask stage 720, said mask being imaged with the aid of the projection lens into an image plane in which a substrate 761 coated with a light-sensitive layer (e.g., photoresist) is situated on a wafer stage 760.

In some implementations, the computer used to analyze the detection signals provided by the detector 150 of FIG. 1 or 250 of FIG. 2, e.g., according to the principle illustrated in FIGS. 4A-4C and described above can include one or more data processors for processing data, one or more storage devices for storing data, such as one or more databases, and/or one or more computer programs including instructions that when executed by the evaluation unit causes the evaluation unit to carry out the processes. The computer can include one or more input devices, such as a keyboard, a mouse, a touchpad, and/or a voice command input module, and one or more output devices, such as a display, and/or an audio speaker. The computer can show graphical user interfaces on the display to assist the user of the device shown in FIGS. 1 and 2.

In some implementations, the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for processing a microstructured component described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to the person skilled in the art, for example through combination and/or exchange of features of individual embodiments. Accordingly, it goes without saying for the person skilled in the art that such variations and alternative embodiments are also encompassed by the present invention, and the scope of the invention is defined by the appended patent claims and the equivalents thereof.

What is claimed is:

1. A device for processing a microstructured component, comprising:
    an ion beam source configured to apply an ion beam to at least regions of the component, wherein an ion energy of the ion beam is no more than 5 keV; and
    a detector for detecting particles, including ions, backscattered at the component;
    wherein the device is configured to define an end of the processing on the basis of a detector signal supplied by the detector,
    wherein the ion beam is selected such that impinging the ion beam on different target materials having different atomic numbers produces different backscatter coefficients, and a detectable material contrast is present at a transition between different target materials during application of the ion beam to the regions of the component.

2. The device of claim 1, wherein the detector is designed to detect electrons backscattered at the component.

3. The device of claim 1, wherein an ion energy of the ion beam is no more than 3 keV.

4. The device of claim 3 in which the ion energy of the ion beam is no more than 2 keV.

5. The device of claim 1, wherein an ion energy of the ion beam has a value ranging from 0.1 to 5 keV.

6. The device of claim 5 in which the ion energy of the ion beam has a value ranging from 0.5 to 3 keV.

7. The device of claim 6 in which the ion energy of the ion beam has a value ranging from 1 to 2 keV.

8. The device of claim 1, wherein the ion beam comprises ions from the group containing hydrogen (H) ions, lithium (Li) ions, sodium (Na) ions, potassium (K) ions, rubidium (Rb) ions, caesium (Cs) ions, nitrogen (N) ions, helium (He) ions, neon (Ne) ions, argon (Ar) ions, krypton (Kr) ions and xenon (Xe) ions.

9. The device of claim 8 in which the ion beam comprises at least one of a hydrogen (H) ion beam, a lithium (Li) ion beam, a sodium (Na) ion beam, a potassium (K) ion beam, a rubidium (Rb) ion beam, a caesium (Cs) ion beam, a nitrogen (N) ion beam, a helium (He) ion beam, a neon (Ne) ion beam, a krypton (Kr) ion beam, or a xenon (Xe) ion beam.

10. The device of claim 9 in which the ion beam comprises at least one of a lithium (Li) ion beam, a sodium (Na) ion beam, a potassium (K) ion beam, a rubidium (Rb) ion beam, or a caesium (Cs) ion beam.

11. The device of claim 1, wherein the ion beam has a focal diameter of less than 10 nm.

12. The device of claim 11 in which the ion beam has a focal diameter of less than 5 nm.

13. The device of claim 12 in which the ion beam has a focal diameter of less than 2 nm.

14. The device of claim 1, wherein the device further comprises a gas supply for additionally applying a process gas to the component.

15. The device of claim 1, wherein the device is configured to have sufficient resolution to enable the device to process structures present on the microstructured component that have a structure size of less than 10 nm.

16. The device of claim 1, wherein the device is configured to repeatedly scan the regions of the microstructured component with the ion beam to process the microstructured component by an ablation of material situated between structures present on the microstructured component.

17. The device of claim 1, comprising a mask stage to support a microlithographic mask, wherein the device is configured to process the microlithographic mask.

18. The device of claim 1, comprising a wafer stage to support a microlithographically structured wafer, wherein the device is configured to process the microlithographically structured wafer.

19. A method for processing a microstructured component, wherein the method includes the following steps:
    applying an ion beam to the component to perform an ablation of material situated between structures present on the microstructured component, wherein an ion energy of the ion beam is no more than 5 keV;
    using a detector to detect particles backscattered at the component, wherein the particles comprise ions; and
    defining an end of the processing on the basis of a detector signal supplied by the detector;
    wherein the ion beam is selected such that impinging the ion beam on different target materials having different atomic numbers produces different backscatter coefficients, and a detectable material contrast is present at a transition between different target materials during application of the ion beam to the regions of the component.

20. The device of claim 1, wherein the device is configured to define the end of the processing on the basis of a detector signal supplied by the detector indicating a change in backscatter coefficients.

21. The device of claim 1 in which the device is configured to define the end of the processing on the basis of detecting a change in the backscatter coefficient.

22. The method of claim 19, wherein the method is carried out using a device according to claim 1.

23. The method of claim 19, wherein the particles comprise electrons.

24. A method for processing a microstructured component, the method comprising:
    applying an ion beam to the component, wherein an ion energy of this ion beam is no more than 5 keV;
    using a detector to detect ions backscattered at the component; and
    modifying a processing of the component by the ion beam on the basis of a detector signal supplied by the detector indicating a change in backscatter coefficients.

25. The method of claim 24, comprising defining an end of the processing on the basis of a detector signal supplied by the detector indicating the change in backscatter coefficients.

26. A device for processing a microstructured component, comprising:
- an ion beam source configured to apply an ion beam to at least regions of the component, in which an ion energy of the ion beam is no more than 5 keV; and
- a detector for detecting ions backscattered at the component;
- wherein the device is configured to modify a processing of the component by the ion beam based on a change in backscatter coefficients.

27. The apparatus of claim 26 in which the device is configured to define an end of the processing on the basis of a detector signal supplied by the detector indicating a change in the backscatter coefficients.

28. The apparatus of claim 26 in which the ion beam source comprises a low temperature ion source.

29. The apparatus of claim 28 in which the ion beam source comprises a first laser that is configured to cool neutral atoms in a magneto-optical trap to produce low temperature atoms, and a second laser that is configured photoionize the low temperature atoms to produce low temperature ions.

30. The device of claim 26, a wherein the microstructured component comprises a first material and a second material different from the first material,
- wherein the detector is configured to detect particles backscattered at the component and generate a detection signal;
- wherein the device is configured to modify the processing of the component by the ion beam based on a change in the detector signal supplied by the detector indicating a transition between the first material and the second material in the component.

31. The apparatus of claim 30 in which the device is configured to define an end of the processing of the component on the basis of the change in the detector signal indicating the transition between the first material and the second material in the component.

* * * * *

UNITED STATES PATENT AND TRADEMARK OFFICE
CERTIFICATE OF CORRECTION

| | |
|---|---|
| PATENT NO. | : 11,487,211 B2 |
| APPLICATION NO. | : 17/116127 |
| DATED | : November 1, 2022 |
| INVENTOR(S) | : Nicole Auth, Timo Luchs and Joachim Welte |

It is certified that error appears in the above-identified patent and that said Letters Patent is hereby corrected as shown below:

In the Specification

Column 5
Line 9, delete "3A-3B:" and insert -- 3A-3B. --

Column 6
Line 19, delete "6A-6B):" and insert -- 6A-6B). --

In the Claims

Column 11
Line 11, Claim 27, delete "apparatus" and insert -- device --
Line 15, Claim 28, delete "apparatus" and insert -- device --
Line 17, Claim 29, delete "apparatus" and insert -- device --

Column 12
Line 3, Claim 30, after "claim 26," delete "a"
Line 14, Claim 31, delete "apparatus" and insert -- device --

Signed and Sealed this
Tenth Day of January, 2023

Katherine Kelly Vidal
*Director of the United States Patent and Trademark Office*